United States Patent [19]
Arendt et al.

[11] Patent Number: 5,057,486
[45] Date of Patent: * Oct. 15, 1991

[54] SYNTHESIS OF BI-PB-CA-SR-CU-O ORIENTED POLYCRYSTAL SUPERCONDUCTOR

[75] Inventors: Ronald H. Arendt, Schenectady; Mary F. Garbauskas, Clifton Park, both of N.Y.

[73] Assignee: General Electric Company, Schenectady, N.Y.

[*] Notice: The portion of the term of this patent subsequent to Oct. 15, 2008 has been disclaimed.

[21] Appl. No.: 489,309

[22] Filed: Mar. 5, 1990

[51] Int. Cl.$^5$ .................. C01F 11/02; C01G 3/02; C01G 21/02; C01G 29/00
[52] U.S. Cl. .................. 505/1; 252/521; 423/604; 423/617; 423/618; 423/635; 501/123; 505/727; 505/782
[58] Field of Search .................. 505/782, 727.1; 252/521; 423/604, 618, 617, 635; 501/123

[56] References Cited

U.S. PATENT DOCUMENTS

| 4,880,771 | 11/1989 | Cava et al. | 505/1 |
| 4,906,609 | 3/1990 | Yamauchi et al. | 505/1 |
| 4,939,121 | 7/1990 | Rybka | 505/1 |
| 4,942,151 | 7/1990 | Capone et al. | 505/1 |
| 4,943,557 | 7/1990 | Ling | 505/1 |

FOREIGN PATENT DOCUMENTS 8809312  12/1988  PCT Int'l Appl. .................. 505/1

OTHER PUBLICATIONS

Arendt, "Aligned Sintered Compacts of $RBa_2Cu_3O_7$...", *Mat. Res. Soc. Symp. Proc.*, vol. 94, Nov./Dec. 1987, pp. 203–208.

Furcone, "Spin-On $Bi_4Sr_3Ca_3Cu_4O_{16}$ Superconducting Thin Films", *Appl. Phys. Lett.*, vol. 52(25), Jun. 20, 1988, pp. 2180–2182.

Chen, "Scaling of Critical Current Density in Field-Aligned...", *J. Appl. Phys.*, vol. 65(9), May 1, 1989, pp. 3874–3878.

Neurgaonka, "Densification of Grain-Oriented High to Superconductive...", *Mat. Res. Bull.*, vol. 24, Dec. 1989, pp. 1541–1547.

Tien, "Hot Isostatic Pressing (HIP) for the Densification...", *MRS: High Temp. Super II*, Apr. 1988, pp. 73–76.

Jin, "High To Superconductors-Comosite Wire Fabrication", *Appl. Phys. Lett.*, vol. 51(3), Jul. 26, 1987, pp. 203–204.

Dou, S. X., Liu, H. K., Apperley, M. H., Song, K. H., & Sorrell, C. C., "Critical Current Density In Superconducting Bi-Pb-Sr-Ca-Cu-O Wires And Coils", Supercond. Sci. Technol. 3 (1990), pp. 138–142.

*Primary Examiner*—Paul Lieberman
*Assistant Examiner*—John Boyd
*Attorney, Agent, or Firm*—James Magee, Jr.; James C. Davis, Jr.

[57] ABSTRACT

A particulate mixture comprised of $Bi_2CaSr_2Cu_2O_{8\pm x}$ where x ranges from 0 to 0.5, $Ca_2CuO_3$, cupric oxide and lead oxide, wherein the $Bi_2CaSr_2Cu_2O_{8\pm x}$ crystals are oriented with their c-axis at least sufficiently parallel to each other so as not to differ significantly from a common direction, is initially reacted producing an intermediate swollen partially reacted product which is pressed to remove the swelling and then sintered to produce a superconductive $Bi_2yPb_yCa_2Sr_2Cu_3O_{10\pm z}$ body where y ranges from 0.1 to 0.5 and z ranges from zero to less than 1.

8 Claims, No Drawings

SYNTHESIS OF BI-PB-CA-SR-CU-O ORIENTED POLYCRYSTAL SUPERCONDUCTOR

This is related to the following copending applications which are assigned to the assignee hereof and incorporated herein by reference:

U.S. Ser. No. (RD-19,748) filed about Feb. 10, 1990, for R. H. Arendt and M. F. Garbauskas for "SYNTHESIS OF Bi-Pb-Ca-Sr-Cu-O SUPERCONDUCTIVE MATERIAL"; and U.S. Ser. No. 07/399,197 filed Aug. 28, 1989, for R. H. Arendt for "SYNTHESIS OF Bi-Ca-Sr-Cu-O SUPERCONDUCTIVE MATERIAL".

The present invention relates to the preparation of a superconductive oxide body in the system bismuth-lead-calcium-strontium-copper-oxygen. Specifically, the present invention is directed to a process for producing a superconductive polycrystalline sintered body containing the superconductive phase $Bi_{2-y}Pb_yCa_2Sr_2Cu_3O_{10\pm z}$ where y ranges from 0.1 to 0.5, preferably from 0.25 to 0.35, and most preferably it is 0.3, and z ranges from zero to less than 1. This phase or composition also is referred to herein as (2223). In the present sintered body, the c-axis of the $Bi_{2-y}Pb_yCa_2Sr_2Cu_3O_{10\pm z}$ phase are oriented at least sufficiently parallel to each other so as not to differ significantly from a common direction, i.e. the c-axis of the (2223) phase are substantially parallel to each other. The fraction of the (2223) grains which are randomly oriented, i.e. those with their c-axis differing significantly from a common direction, generally is small and not significant.

The present invention utilizes as a reactant, superconductive $Bi_2CaSr_2Cu_2O_{8\pm x}$ where x ranges from 0 to 0.5. This superconductive reactant also is referred to herein as (2122).

Briefly stated, in one embodiment, the present process for producing a solid sintered body containing oriented superconductive crystalline $Bi_{2-y}Pb_yCa_2Sr_2Cu_3O_{10\pm z}$ phase where y ranges from 0.1 to 0.5 and z ranges from zero to less than 1 in an amount of at least 90% by weight of said body comprises the following steps:

(a) forming a slurry comprised of a particulate mixture of reactants in an organic liquid vehicle, said particulate mixture of reactants being comprised of $Bi_2CaSr_2Cu_2O_{8\pm x}$ where x ranges from 0 to 0.5, $Ca_2CuO_3$, cupric oxide, and lead oxide, said mixture of reactants being formulated to produce said superconductive phase and to provide an excess amount of said $Ca_2CuO_3$ and cupric oxide sufficient to drive the reaction to produce said superconductive phase in said sintered body, said $Ca_2CuO_3$ and cupric oxide in said mixture being present in substantially mole equivalents to each other, said $Bi_2CaSr_2Cu_2O_{8\pm x}$ being comprised of substantially monodispersed crystals, said particulate mixture being a sinterable mixture;

(b) applying an aligning magnetizing field to said slurry to align said $Bi_2CaSr_2Cu_2O_{8\pm x}$ crystals with their c-axis substantially parallel to each other, said reactants being sufficiently suspended in said slurry to enable said alignment, said reactants being present in said slurry in an amount which enables said alignment;

(c) removing said organic liquid vehicle in said aligning field producing a cast body wherein said $Bi_2CaSr_2Cu_2O_{8\pm x}$ crystals are aligned with their c-axis substantially parallel to each other, said cast body having a thickness with a pressing surface to which said c-axis are substantially perpendicular;

(d) firing said cast body in an oxidizing atmosphere at a reaction temperature ranging from 820° C. to 860° C. converting a sufficient amount of said $Bi_2CaSr_2Cu_2O_{8\pm x}$ crystals to said superconductive crystalline $Bi_{2-y}Pb_yCa_2Sr_2Cu_3O_{10\pm z}$ phase to produce a significantly dilated intermediate partly reacted sintered product, the c-axis of said superconductive phase being substantially parallel to each other;

(e) cooling said intermediate product in an oxidizing atmosphere producing a solid intermediate product having a significantly dilated thickness with a pressing surface to which the c-axis of said superconductive $Bi_{2-y}Pb_yCa_2Sr_2Cu_3O_{10\pm z}$ phase and remaining $Bi_2CaSr_2Cu_2O_{8\pm x}$ are substantially perpendicular;

(f) applying to said pressing surface of said intermediate product a uniaxial pressure which is substantially parallel to said c-axis of said superconductive phase to remove said dilation to produce a pressed product with a thickness which is the same or less than said thickness of said cast body;

(g) finally firing the resulting pressed product in an oxidizing atmosphere at a reaction temperature ranging from 820° C. to 860° C. to produce a finally sintered reaction product wherein said superconductive phase comprises at least 90% by weight of said reaction product, said reaction temperature being below the temperature at which sufficient liquid forms to prevent production of said sintered products, said pressed product undergoing no significant dilation in said final firing; and (h) cooling said finally sintered reaction product in an oxidizing atmosphere producing said solid sintered body having an open porosity ranging from 5% to less than 25% by volume of the body, said steps (d), (e), and (f) being carried out sufficiently to produce a pressed product in step (f) which undergoes no significant dilation of said pressed product in step (g) thereby enabling production of said sintered body.

Briefly stated, in another embodiment, the present process for producing a solid sintered body containing oriented superconductive Crystalline $Bi_{2-y}Pb_yCa_2Sr_2Cu_3O_{10\pm z}$ phase where y ranges from 0.1 to 0.5 and z ranges from zero to less than 1 in an amount of at least 90% by weight of said body comprises the following steps:

(a) forming a slurry comprised of a particulate mixture of reactants in an organic liquid vehicle, said particulate mixture of reactants being comprised of $Bi_2CaSr_2Cu_2O_{8\pm x}$ where x ranges from 0 to 0.5, $Ca_2CuO_3$, cupric oxide, and lead oxide, said mixture of reactants being formulated to produce said superconductive phase and to provide an excess amount of said $Ca_2CuO_3$ and cupric oxide sufficient to drive the reaction to produce said superconductive phase in said sintered body, said $Ca_2CuO_3$ and cupric oxide in said mixture being present in substantially mole equivalents to each other, said $Bi_2CaSr_2Cu_2O_{8\pm x}$ being comprised of substantially monodispersed crystals, said particulate mixture being a sinterable mixture;

(b) applying an aligning magnetizing field to said slurry to align said $Bi_2CaSr_2Cu_2O_{8\pm x}$ crystals with their c-axis substantially parallel to each other, said reactants being sufficiently suspended in said slurry to enable said alignment, said reactants being present in said slurry in an amount which enables said alignment;

(c) removing said organic liquid vehicle in said aligning field to produce a cast body wherein said $Bi_2CaSr_2Cu_2O_{8\pm x}$ crystals are aligned with their c-axis substantially parallel to each other and substantially perpendicular to a surface of said cast body;

(d) firing said cast body in an oxidizing atmosphere at a temperature ranging from 820° C. to 830° C. producing a preliminary body wherein said particles are directly bonded to each other and wherein said superconductive phase is not detectable by x-ray diffraction analysis; (e) cooling said preliminary body in an oxidizing atmosphere;

(f) sectioning said preliminary body to produce at least one section having a thickness with a pressing surface to which the c-axis of said resulting bonded $Bi_2CaSr_2Cu_2O_{8\pm x}$ crystals are substantially perpendicular;

(g) encapsulating said section with silver foil and/or sheet producing a pressure transmitting silver encapsulation;

(h) firing said silver encapsulated section in an oxidizing atmosphere at a reaction temperature ranging from 820° C. to 860° C. converting a sufficient amount of said $Bi_2CaSr_2Cu_2O_{8\pm x}$ crystals to said superconductive crystalline $Bi_{2-y}Pb_yCa_2Sr_2Cu_3O_{10\pm z}$ phase to produce a significantly dilated intermediate partly reacted sintered product, the c-axis of said superconductive phase being substantially parallel to each other;

(i) cooling the resulting encapsulated intermediate product in an oxidizing atmosphere producing an encapsulated solid intermediate product having a significantly dilated thickness with a pressing surface to which the c-axis of said superconductive $Bi_{2-y}Pb_yCa_2Sr_2Cu_3O_{10\pm z}$ phase and remaining $Bi_2CaSr_2Cu_2O_{8\pm x}$ are substantially perpendicular;

(j) applying through said silver encapsulation directly to said pressing surface of said solid intermediate product a uniaxial pressure which is substantially parallel to said c-axis of said superconductive phase to remove said dilation to produce a pressed product with a thickness which is the same or less than said thickness of said section;

(k) finally firing the resulting silver encapsulated pressed product in an oxidizing atmosphere at a reaction temperature ranging from 820° C. to 860° C. to produce a finally sintered reaction product wherein said superconductive phase comprises at least 90% by weight of said reaction product, said reaction temperature being below the temperature at which sufficient liquid forms to prevent production of said sintered products, said pressed product undergoing no significant dilation in said final firing;

(l) cooling the resulting silver encapsulated finally sintered product in an oxidizing atmosphere producing said solid sintered body having an open porosity ranging from 5% to less than 25% by volume of the body, said steps (h), (i), and (j) being carried out sufficiently to produce a pressed product in step (j) which undergoes no significant dilation in step (k) thereby enabling production of said sintered body; and (m) removing said silver encapsulation from said sintered body.

In carrying out the present process, a superconductive powder comprised of the reactant $Bi_2CaSr_2Cu_2O_{8\pm x}$ where x ranges from 0 to 0.5, i.e. (2122), is used. Preferably, x has a value of 0. The (2122) powder should contain (2122) in an amount of at least 90% by weight of the powder and all other components which may be present in the (2122) powder should have no significant deleterious effect on the present process. Preferably, the (2122) powder contains (2122) in an amount greater than 95%, or greater than 98%, by weight of the powder. More preferably, the (2122) powder is phase pure (2122) according to X-ray diffraction analysis.

Preferably, the (2122) powder has a zero resistance transition temperature, i.e. a temperature at which there is no electrical resistance, greater than about 70K, and preferably it is about 80K.

(2122) material can be produced in a known manner by solid state reaction, i.e. firing an intimate mixture of the constituent oxides in an oxidizing atmosphere, for example, air, and cooling the reaction product in an oxidizing atmosphere. However, it is difficult to produce a powder containing (2122) in an amount greater than 90% to 95% by weight of the powder by solid state reaction.

Preferably, the (2122) material is produced according to U.S. Ser. No. 07/399,197 which discloses a process for producing a sinterable superconductive powder comprised of a composition represented by the formula $Bi_2CaSr_2Cu_2O_x$ where x ranges from about 7.5 to about 8.5, which comprises providing a first mixture of calcium carbonate, strontium carbonate and copper oxide, firing said first mixture in air at a temperature at which no liquid forms until said carbonates decompose leaving no significant amount thereof resulting in a substantially combined Ca-Sr-Cu-oxide product, forming a second mixture comprised of said oxide product, bismuth sesquioxide and an alkali chloride solvent, said Ca-Sr-Cu-oxide product and bismuth sesquioxide being formulated to produce said superconductive composition, said alkali chloride solvent being selected from the group consisting of sodium chloride, potassium chloride and combinations thereof, heating said second mixture to a reaction temperature at least sufficient to melt said chloride solvent, maintaining said reaction temperature continuously dissolving said oxide product and bismuth sesquioxide in the resulting molten chloride solvent and continuously reacting the oxides dissolved in said molten chloride solvent thereby precipitating a material of said superconductive composition, said alkali chloride solvent being present in an amount at least sufficient to carry out the production of said superconductive material, cooling the resulting reacted mass to solidify the molten chloride, adding water to the resulting solidified mass dissolving the alkali chloride, recovering said precipitated superconductive material, and comminuting said superconductive material to produce a powder.

The (2122) material produced according to U.S. Ser. No. 07/399,197 generally contains (2122) in an amount greater than 98% by weight of the material, and usually, it is phase pure (2122) according to X-ray diffraction analysis.

(2223) material cannot be produced according to the process disclosed in U.S. Ser. No. 07/399,197.

Preferably, before it is admixed with the other reactants, the (2122) material is comminuted to produce a powder substantially comprised of monodispersed crystals of desired size, determined empirically, which enables the present reaction to be carried out. Preferably, the (2122) powder has an average particle size ranging in its longest dimension up to 10 microns, and more preferably it is less than 2 microns. Conventional comminuting techniques can be used which have no significant deleterious effect on the resulting powder.

In the present process, an oxide product comprised of a mixture of $Ca_2CuO_3$ and CuO is used to form the mixture of reactants. Generally, this oxide product is comprised of a substantially uniform, or uniform, i.e. intimate, mixture of $Ca_2CuO_3$ and CuO.

Generally, to produce the oxide product, a particulate mixture of calcium carbonate and copper oxide initially is formed which preferably is uniform or substantially uniform. The mixture is of a size, determined empirically, which enables production of the oxide product, and frequently ranges in size from submicron to 20 microns, preferably having an average particle size which is submicron. The mixture can be produced by conventional techniques which have no significant deleterious effect on the components. Preferably, the components are wet milled at room temperature in distilled water, preferably with zirconia milling media, and then dried in air. Generally, the mixture is formulated to produce mole equivalents, or substantially mole equivalents, of calcium oxide and cupric oxide. The resulting mixture is fired in air at about atmospheric pressure at a temperature at least sufficient to decompose the carbonate but not so high as to form a significant amount of liquid. A significant amount of liquid would separate the components in areas of the mixture resulting in a significantly non-uniform product. Generally, firing temperature ranges from greater than about 850° C. to less than about 950° C., and preferably it is about 925° C. Firing is carried out at least until no significant amount of the carbonate remains. In this firing, any cuprous oxide forms cupric oxide and the carbonate decomposes to calcium oxide and reacts with cupric oxide to form the oxide product comprised of a mixture of $Ca_2CuO_3$ and CuO. The oxide product is cooled in air at about atmospheric pressure, and preferably, it is furnace cooled to room temperature. In the oxide product, $Ca_2CuO_3$ and CuO are present in mole equivalents, or substantially mole equivalents, to each other. Generally, the oxide product contains no significant amount of, and preferably it is free of, calcium oxide and cuprous oxide. The reaction is as follows:

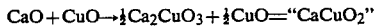

$$CaO + CuO \rightarrow \tfrac{1}{2}Ca_2CuO_3 + \tfrac{1}{2}CuO = \text{``}CaCuO_2\text{''}$$

The oxide product is friable, and preferably, before it is mixed with the other reactants, it is lightly dry ground in a conventional manner, for example, by mortar and pestle, to produce a flowable powder, generally about 40 mesh (U.S. Screen Size).

Generally, lead oxide powder is used and is satisfactory in the particle size range in which it is available commercially, which ranges in average particle size from submicron to 10 microns.

Generally, in carrying out the present process, a slurry of the particulate mixture of the reactants comprised of the (2122) material, $Ca_2CuO_3$, cupric oxide and lead oxide in an organic liquid vehicle is formed. The reactants are used in amounts which will produce the superconductive (2223) phase of desired composition in the present process and such amounts are determined empirically. Specifically, the mixture of reactants is formulated to produce (2223) and to include an excess amount of the oxide product comprised of the mixture of $Ca_2CuO_3$ and CuO, or for convenience also referred to herein as "$CaCuO_2$". The excess amount of "$CaCuO_2$" should be sufficient to convert (2122) to the required amount of (2223) in the present process. Such excess amount of the "$CaCuO_2$" is determined empirically and depends largely on the fineness of the reactants. The finer the reactants, the greater is the contact therebetween and the less is the excess amount of "$CaCuO_2$" required to drive the reaction to form (2223). The reaction is as follows:

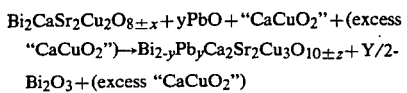

$$Bi_2CaSr_2Cu_2O_{8\pm x} + yPbO + \text{``}CaCuO_2\text{''} + (\text{excess ``}CaCuO_2\text{''}) \rightarrow Bi_{2-y}Pb_yCa_2Sr_2Cu_3O_{10\pm z} + Y/2\text{-}Bi_2O_3 + (\text{excess ``}CaCuO_2\text{''})$$

Generally, from 1.1 to 1.75 moles of total "$CaCuO_2$" is used per mole of (2122) in the mixture of reactants.

Generally, the amount of lead oxide depends largely on the particular amount of Pb desired in (2223).

The organic liquid vehicle used in forming the slurry is one in which the particulate reactants can be effectively dispersed. Generally, it is comprised of a solution of organic liquid and dispersant. Generally, the liquid vehicle is one in which the reactants are inert or substantially inert, i.e. with which they do not react. Preferably, it is non-aqueous or contains no significant amount of water. Also, preferably, the organic liquid has a boiling point of less than 100° C., and preferably it is heptane.

The dispersant is an organic material and should be soluble in the organic liquid. It need only be used in an amount which effectively aids in dispersing the reactants and such amount is determined empirically. Generally, the dispersant is used in an amount of less than 10%, preferably by volume of the total volume of slurry. The dispersant, or liquid vehicle, should volatilize away from the cast body at an elevated temperature ranging up to 820° C. leaving no amount thereof which would have a significantly deleterious effect on the transition temperature of the resulting sintered body. Such dispersants are commercially available.

The particulate mixture of reactants is sufficiently uniformly dispersed or suspended in the slurry to enable sufficient magnetic alignment of the (2122) crystals along their preferred axis of magnetization to produce the present sintered body. Preferably, the particulate mixture of reactants is uniformly, or substantially uniformly, suspended in the slurry.

The particulate mixture of reactants is present in the slurry in an amount which enables the desired magnetic alignment of the (2122) crystals along their preferred axis of magnetization and such amount is determined empirically. Generally, the total content of reactants is less than 60% by volume, frequently ranging from greater than 30% by volume to 50% by volume, of the total volume of slurry.

To produce the present slurry, conventional mixing and comminuting techniques can be used which have no significant deleterious effect on the components and do not introduce undesirable impurities into the resulting sintered body. The reactants are admixed to produce a particulate mixture which is sufficiently uniform and is of a sufficiently fine size to carry out the reaction and sintering to produce the present superconductive (2223) body. Preferably, the reactants are admixed to produce as intimate a mixture as possible without significant contamination to insure good contact.

In a preferred mixing and comminuting embodiment, the reactants are wet milled and the resulting milled slip is dried in a dry gas. Generally, the reactants are milled in an organic liquid medium in which they are inert or substantially inert, i.e. with which they do not react. Generally, the liquid medium is non-aqueous or contains no significant amount of water. Generally, the liquid medium is comprised of a solution of organic liquid and a few drops of organic dispersant to aid milling. Preferably, the organic liquid has a boiling point of less than 100° C., and preferably it is heptane. Preferably, the dispersant is the same as to be used in forming the slurry. Preferably, milling is carried out at about room temperature and zirconia milling media is used. Preferably, the milled slip, which usually flows like water, is dried in a dry gas with which it does not react, or does not react to any significant extent. Conveniently, the dry gas is nitrogen, air, or mixtures thereof. By a dry gas herein, it is meant a gas containing 100 parts per million of water or less. Evaporation can be carried out at about atmospheric pressure or under a partial vacuum. Preferably, evaporation is carried out at a temperature ranging from about 50° C. to about 70° C.

The resulting dry mixture and the present organic liquid vehicle can be admixed in a conventional manner, usually by milling, in amounts which produce the present slurry. Preferably, milling is carried out at about room temperature and zirconia milling media is used.

In the present slurry, the particulate mixture of reactants is of a sinterable size determined empirically. The (2122) powder generally has an average particle size ranging in its longest dimension to less than 10 microns, and preferably it is less than 2 microns, and the remaining reactants preferably have an average particle size ranging from submicron to 2 microns. The (2122) powder is comprised, or substantially comprised, of monodispersed crystals.

Generally, the present slurry, which usually has the viscosity of thick molasses, is poured into a firing container, usually a pan, with which the resulting cast body will not react, or not react to any significant extent, at firing temperature. Generally, at firing temperatures ranging from 820° C. to 825° C., alumina containers are suitable. However, at temperatures higher than 825° C., gold or silver containers usually are required. Preferably, the firing containers are provided with loose fitting lids to prevent possible loss of any of the reactants, particularly lead, and to provide a more uniform firing atmosphere thereby promoting production of a more uniform fired product.

In carrying out the present process, an aligning magnetizing field is applied to the slurry to align, or at least substantially align, the (2122) crystals along their preferred axis of magnetization which is parallel to their "c" axis. Generally, the aligning magnetizing field ranges from about 1 kiloersted to about 100 kiloersteds and is determined empirically.

The aligning magnetizing field is maintained on the slurry until the liquid is removed, usually by evaporating away, to form the present aligned cast body in the container. Generally, such magnetic alignment and evaporation to form the cast body is carried out in air at about atmospheric pressure and at room temperature. Generally, the cast body is dry, or substantially dry, i.e. preferably it is free of liquid, or contains no significant amount of liquid.

The cast body takes the form of the cavity of the firing container. The alignment of the (2122) crystals in the cast body should be sufficient to produce the present sintered body. In the cast body, the c-axis of the (2122) crystals are parallel or substantially parallel to each other and are perpendicular or substantially perpendicular to a surface of the cast body which, in one embodiment, comprises the pressing surface of the resulting intermediate product.

In one embodiment, the cast body is fired to produce an intermediate partly reacted sintered product. In a preferred embodiment, the cast body is fired to produce a preliminary bonded body. The heating rate of the cast body to the desired maximum firing temperature should be sufficiently slow to prevent any gas generated by thermal decomposition of any deflocculant residue from having a significant effect on the alignment of the (2122) crystals. Such heating rate is determined empirically and depends largely on the amount of deflocculant residue and the size of the body. Generally, the heating rate ranges from 20° C. to 50° C. per hour.

In the preferred embodiment, the cast body initially is fired at a temperature ranging from 820° C. to 830° C. to produce a preliminary bonded body which has sufficient mechanical strength for sectioning, i.e. a body wherein the particles or crystals are directly bonded to each other. Such initial firing is not carried out long enough to produce a significant amount of the (2223) phase.

The preliminary body is cooled, generally furnace-cooled, generally to room temperature, producing a preliminary solid porous body. The (2223) phase is not detectable in the preliminary body by x-ray diffraction analysis. Generally, the dimensions of the preliminary body do not differ significantly from those of the cast body.

In the preliminary body, the c-axis of the (2122) bonded crystals are at least substantially parallel to each other and substantially perpendicular to a surface thereof. The preliminary body is sectioned to produce at least one section, usually a plurality of sections, each having a surface, i.e. its pressing surface, to which the aligned c-axis of the (2122) crystals are perpendicular or substantially perpendicular. Generally, the c-axis also are perpendicular, or substantially perpendicular, to the surface opposite the pressing surface. The pressing surface and its opposite surface comprise the thickness of the section or product herein. The pressing surface of the section comprises the pressing surface of the resulting intermediate product.

Sectioning is carried out to produce a section of desired size and shape. Generally, each section has two major opposed flat surfaces or faces wherein one such surface is the pressing surface. Generally, each section is in the form of a bar, rectangle, or square with a thickness ranging from 0.010 inch to many inches, frequently ranging from 0.1 to 0.25 inches. Sectioning can be carried out in a conventional manner, such as, for example, with a razor and hammer.

Each section is enveloped, i.e. encapsulated, with silver foil, sheet, or a combination thereof. Generally, the foil and sheet are flexible at room temperature. Usually, the thickness of the foil is less than 0.005 inch, and thickness of the sheet is less than 0.050 inch. The silver encapsulation should leave none of the section exposed, and preferably, it forms a hermetic seal.

The silver encapsulation is permeable to oxygen. It provides a substantially uniform reaction atmosphere and prevents possible loss, or significant loss, of the reactants by evaporation, particularly lead. Also, the silver encapsulation prevents reaction of the section with the firing container thereby enabling the use of cheap firing containers, such as alumina, at any reaction temperature. The silver encapsulation does not react with the section, or does not react in an amount deleterious to the (2223). The silver encapsulation is pressure transmitting.

The silver encapsulated section is fired in an oxidizing atmosphere at a reaction temperature ranging from 820° C. to 860° C. to react the reactants to convert (2122) to (2223) in an amount sufficient to produce a significantly dilated, i.e. swollen, intermediate partly reacted product. Specifically, conversion of the (2122) crystals to the (2223) crystals results in growth of the (2223) crystals which causes dilation. As a result, with significant conversion of (2122) crystals to (2223), a significantly swollen intermediate product is produced having an open porosity generally greater than 25% by volume and too large to produce the present sintered body.

Specifically, in one embodiment where a single firing step is used to produce the intermediate product, the (2122) crystals are converted to produce the (2223) phase generally in an amount ranging from greater than 20% to less than 70% by weight of the product. In this single firing step to produce the intermediate product, the particular amount of conversion should be sufficient to enable the production of a pressed product which undergoes no dilation, or no significant dilation in the final firing to produce the finally sintered reaction product.

The resulting encapsulated intermediate product is cooled, generally furnace cooled, in an oxidizing atmosphere, generally to room temperature, producing a solid intermediate partially reacted sintered product. The c-axis orientation of the resulting (2223) crystals is substantially the same as, or does not differ significantly from, the c-axis orientation of the (2122) crystals.

In the preferred embodiment of the present process, a uniaxial pressure is applied through the silver encapsulation directly to the pressing surface of the solid intermediate product. Generally, such pressure is applied at room temperature and can be applied in a conventional manner, such as, for example, by means of a hydraulic press. The uniaxial pressure is applied parallel, or substantially parallel, to the c-axis of the (2223) crystals. The uniaxial pressure should have no significant deleterious effect on the c-axis alignment of the (2223) crystals and remaining (2122) crystals. The particular pressure applied is determined empirically. It should reduce the thickness of the intermediate product to produce a pressed product with a thickness which is the same as, and preferably which is less than, the thickness of the section before it is fired.

In a most preferred embodiment, firing to produce an intermediate product and application of uniaxial pressure to the resulting dilated intermediate product is repeated sufficiently to produce a final pressed intermediate product which can be finally fired to produce the present finally sintered reaction product. In this embodiment, the extent of firing to produce an initial dilated intermediate product, the extent of firing of the resulting pressed intermediate product, and the number of such firings, is determined empirically. Generally, in this embodiment, the firings are carried out until an intermediate product is produced which, when pressed, results in a final pressed product that can be finally fired at reaction temperature without undergoing significant dilation thereby enabling production of the present sintered body. In this embodiment, generally with each firing to produce an intermediate product, the content of (2223) is increased by at least 1%, frequently by at least 5%, by weight of the product. Generally, the final pressed intermediate product contains (2223) in an amount of less than 70% by weight of the product.

In the present process, pressing of the intermediate product pushes (2223) crystals back into contact with remaining reactants and improves their alignment so that conversion of remaining (2122) to (2223) results in insignificant dilation with final firing.

The resulting silver encapsulated final pressed intermediate product is fired in an oxidizing atmosphere at a reaction temperature ranging from 820° C. to 860° C. to produce the finally sintered reaction product wherein the superconductive (2223) phase comprises at least 90% by weight of the product, and generally ranges from 90% to 95% by weight of the product.

The present reaction temperature for producing the intermediate product, for each successive pressed intermediate product, as well as for producing the finally sintered reaction product, frequently ranges from 820° C. to 840° C. and preferably it is 835° C. The reaction temperature should be below the temperature at which a sufficient amount of liquid forms that segregates the reactants sufficiently to prevent production of (2223). The particular reaction temperature is determined empirically and depends largely on the composition of the reactants, i.e. the composition being fired.

Reaction time for producing the intermediate product or products, as well as for producing the finally sintered reaction product, is determined empirically. It should be sufficient to enable the production of the present reaction product containing (2223) in an amount of at least 90% by weight of the product. Generally, total reaction time ranges from 100 to 200 hours.

The finally sintered reaction product is cooled in an oxidizing atmosphere, generally furnace cooled, generally to about room temperature, to produce the present superconductive (2223) sintered body. Frequently, the sintered body has an open porosity ranging from 5% to 20% by volume of the body. Generally, it has no closed porosity, or no significant amount of closed porosity.

By open porosity, it is meant herein pores or voids which are open to the surface of the sintered body, thereby making the interior surfaces accessible to the ambient atmosphere. By closed porosity, it is meant herein closed pores or voids in the sintered body, i.e. pores not open to the surface of the body and therefore not in contact with the ambient atmosphere. Porosity can be determined by standard metallographic techniques, such as, for example, optically examining a polished cross section of the body.

The cooling rate of the fired products can vary provided it has no significant deleterious effect. Specifically, cooling should not be so fast as to cause thermal shock. In one embodiment, the fired products are furnace cooled.

Generally, the oxidizing atmosphere used throughout the present process, i.e. the firing atmosphere and cooling atmosphere, is comprised of at least 1% by volume, or at least 20% by volume, of oxygen and the remainder of the atmosphere is a gas which has no significant deleterious effect on the products such as nitrogen or a noble gas such as argon or helium. Preferably, the oxidizing atmosphere is air. Generally, the oxidizing atmosphere is at about atmospheric pressure.

Generally, the present superconductive sintered body has a zero resistance transition temperature of greater than about 100K, preferably greater than about 105K, and frequently it ranges from about 105K to about 111K.

The present sintered body is useful as a superconducting device such as, for example, a magnetic shield at low temperatures as well as a conductor for magnets, motors, generators, and power transmission lines.

The invention is further illustrated by the following examples wherein the procedure was as follows unless otherwise stated:

The dispersant used was an organic dispersant sold under the trademark Triton X-100.

All firing or heating as well as cooling was carried out in air at about atmospheric pressure.

Firing was carried out in a silicon carbide resistance furnace.

By room temperature herein it is meant a temperature ranging from 15° C. to 30° C.

EXAMPLE 1

In this example, (2122) powder was produced according to U.S. Ser. No. 07/399,197.

A particulate mixture comprised of 100.09 grams of calcium carbonate, 295.26 grams of strontium carbonate and 159.08 grams of cupric oxide was wet milled in a two liter polyethylene jar with 3200 grams of ⅜ inch diameter dense zirconia media using distilled water as the milling fluid and a few drops of dispersant for three hours at room temperature.

The resulting slurry was separated from the zirconia media and dried in air in an oven at from about 120° C. to 150° C.

The resulting powdered material had an average particle size which was submicron. It was placed in shallow, high density, high purity alumina ceramic boats to form a low bulk density powder bed roughly 1.0 to 1.5 cm in depth in each boat. Loose fitting alumina lids were placed on the boats.

The material was heated in air at about atmospheric pressure to 750° C. at a rate of 100° C. per hour to protect the alumina boats from thermal shock, then to 925° C. at a rate of 10° C. per hour. It was maintained at 925° C. for 48 hours and then furnace cooled to room temperature. X-ray diffraction analysis of the resultant product showed that the carbonates had completely decomposed to their respective oxides and that these oxides had reacted with themselves and the cupric oxide to form compounds and had also combined to form solid solutions. No appreciable amounts of the individual oxides was detected.

Two aliquots of the composition comprised of 95.10 grams of the resulting Ca-Sr-Cu-oxide product, 103.85 grams of bismuth sesquioxide and 50 grams of alkali chloride salt were dry-milled in a 500 ml polyethylene jar with 1600 grams of ⅜ inch diameter dense zirconia media for 45 minutes at room temperature. The salt was comprised of NaCl-50 mol % KCl and comprised about 20% by weight of the total amount of oxides and chloride present. The milled material was separated from the media on a Nylon screen and placed in a high density, high purity alumina boat to form a low bulk density powder bed. A loose fitting alumina lid was placed on the boat.

The material was reacted by heating it to 850° C. at a rate of 100° C. per hour, maintained at 850° C. for 44 hours, then furnace cooled to room temperature, all in air at about atmospheric pressure.

The superconductive product was in the form of crystalline aggregates intermixed with the solidified alkali chloride solvent. It was retrieved by dissolving the alkali chlorides in distilled water, assuming a salt solubility of 20 g/100 ml; a period of 30 minutes was allowed for this process. The particulate superconductor, now free of the alkali chlorides, was collected on a filter, washed at room temperature with ten 300 ml aliquots of distilled water, and, finally, two 300 ml aliquots of absolute methanol. The superconductive material was finally air dried on the filter at room temperature at atmospheric pressure.

The superconductivity of the aggregate powder was determined by a conventional technique, i.e. the AC Susceptibility Technique. This technique comprised using the powder as an active element in a L-C resonance circuit and measuring the resonance frequency as a function of the circuit's temperature. The transition temperature is that at which there is a larger than background increase in the resonant frequency.

The powder was determined to have a zero resistance transition temperature of about 73K.

X-ray diffraction analysis of the superconductive aggregate powder showed it to be phase pure $Bi_2CaSr_2Cu_2O_x$. From other work, it was known that x was about 8.

EXAMPLE 2

In this example, an oxide product comprised of mole equivalents of $Ca_2CuO_3$ and CuO was produced.

100.09 grams of calcium carbonate (average particle size of about 1 microns) and 79.54 grams of cupric oxide (average particle size of about 50 microns) were milled with zirconia balls in distilled water containing a few drops of dispersant at room temperature for 2 hours. The resulting slurry was dried in air at 100° C. and the zirconia balls were then separated on a screen.

The resulting dried mixture was fired in air at 925° C. for 48 hours and furnace cooled to room temperature. The resulting product was friable and ground with mortar and pestle to a flowable powder of about 40 mesh (U.S. Screen Size).

X-ray diffraction analysis of this powder showed that it was comprised of a mixture of $Ca_2CuO_3$ and CuO ("$CaCuO_2$"). The mixture appeared uniform.

EXAMPLE 3

50.00 grams of the aggregate (2122) powder produced in Example 1, 11.45 grams of the oxide product powder ("$CaCuO_2$") produced in Example 2 (1.5 moles per mole of (2122)) and 3.77 grams of PbO powder with an average particle size of 2.0 microns (0.3 mole per mole of (2122)) were wet milled with dense zirconia balls in 200 grams of dry heptane containing a few drops of dispersant sold under the trademark Sarkosyl O. Milling was carried out at room temperature for about 0.5 hours. The resulting milled slip was dried under dry nitrogen gas at about atmospheric pressure at about room temperature.

The resulting milled dry particulate mixture appeared to be comprised of an intimate uniform mixture of the reactants. From other work, it was known that the (2122) material was comprised substantially of single crystals having an average length in their longest dimension of less than 2 microns and that the remaining reactants had an average particle size which was submicron. From other work, it was known that this was a sinterable mixture.

About 44 grams of dry heptane and 0.44 grams of Sarkosyl O dispersant were added to the dry mixture still containing the zirconia balls and the mixture was milled at room temperature for about 5 minutes to produce the present slurry.

The slurry was poured into a dense alumina pan residing in a 4.0 Tesla magnetic field and the heptane allowed to evaporate in the applied magnetic field at room temperature in air at about atmospheric pressure. The result was a cake of the reactants showing no evidence of constituent separation, but with cracks normal to the magnetic field direction, a characteristic previously found to indicate that the (2122) had aligned with its c-axis parallel to the applied field.

The cake was lightly sintered in the alumina pan loosely covered with an alumina lid by heating it to 825° C. at 50° C./hour, holding for 2 hours at 825° C., then furnace cooling to room temperature, all in an air atmosphere. There was sufficient shrinkage of the cake, without significant additional cracking, to allow it to fall out of the pan. Bar samples were cleaved from the cake using a razor blade aligned parallel to the existent cracks (and normal to the magnetic field direction). Each bar was about 0.25 inch thick, 0.25 inch wide, and 2 inches long. The c-axis of the (2122) were perpendicular to both major surfaces, i.e. opposite faces, of each bar. One of these faces comprised the pressing surface.

One of the bars was then faced with 0.010" thick Ag sheet on the faces normal to the c-axes, then totally enclosed with 0.002" Ag foil, i.e. totally with about 2 layers of the foil.

The resulting structure was then subjected to a firing step followed by a pressing step. Specifically, the resulting structure was placed in an open alumina pan and heated to 835° C. at 50° C./hour, held at 835° C. for 24 hours, then furnace cooled to room temperature, all in an air atmosphere. From other work done without the silver encapsulation, it was known that the resulting encapsulated partly sintered bar was significantly dilated, that its open porosity was greater than 25%, and that it contained (2223) in an amount of about 25% by weight of the bar.

The structure was then pressed in a hydraulic press at room temperature. Specifically, a uniaxial pressure of about 7,000 psi was applied to one of the faces of the bar, i.e. to the pressing surface, through the Ag encapsulation, for about 30 seconds. From other work done without the silver encapsulation, it was known that this pressing step removed the dilation and sufficient open porosity to produce a pressed bar before it was fired.

The firing and pressing steps were then repeated four times, i.e. the resulting pressed structure was fired and each resulting structure was pressed, four more times to produce a final pressed structure. From other work done without the silver encapsulation, it was known that each pressing step removed the dilation and sufficient open porosity to produce a pressed bar with a thickness less than that of the bar before it was fired.

From other work done without the silver encapsulation, it was known that this final pressed intermediate product would not undergo significant dilation again at reaction temperature.

The encapsulated final pressed structure was heated to 835° C. at 50° C./hour, held at 835° C. for 100 hours, then furnace cooled to room temperature, all in an air atmosphere.

The silver encapsulation was then removed. The resulting finally sintered bar had a thickness which was less than its thickness before its first firing. From other work, it was known that the finally sintered bar contained superconductive (2223) phase in an amount of at least 90% by weight of the bar. Also, from other work, it was known that the finally sintered bar had an open porosity greater than 10% but less than 20% by volume of the bar.

The superconductivity of the resulting finally sintered bar was determined by a conventional technique, i.e. four probe resistivity measurement.

The finally sintered bar, i.e. the present sintered body, was determined to have a zero resistance transition temperature of about 107.5K.

EXAMPLE 4

The procedure used in this example was the same as set forth in Example 3, except that the oxide product powder ("CaCuO$_2$") was used in an amount of 1.10 moles per mole of (2122).

The resulting finally sintered bar was determined to have a zero resistance transition temperature of 108 K.

EXAMPLE 5

The procedure used in this example was the same as set forth in Example 3, except that the oxide product powder ("CaCuO$_2$") was used in an amount of 1.05 mole per mole of (2122).

The resulting finally sintered bar was determined to have a zero resistance transition temperature of 107 K.

EXAMPLE 6

The procedure used in this example was the same as set forth in Example 3, except that the oxide product powder ("CaCuO$_2$") was used in an amount of 1.00 mole per mole of (2122).

The resulting finally sintered bar was determined to have a zero resistance transition temperature of 105 K. The low transition temperature resulted from too low an amount of (2223) in the bar which was caused by not using an excess amount of the oxide product powder as required by the present process.

What is claimed is:

1. A process according to claim 19 for producing a solid sintered body containing oriented superconductive crystalline $Bi_{2-y}Pb_yCa_2Sr_2Cu_3O_{10\pm z}$ phase where y ranges from 0.1 to 15 and z ranges from zero to less than 1 in an amount of at least 90% by weight of said body which comprises the following steps:

(a) forming a slurry comprised of a particulate mixture of reactants in an organic liquid vehicle, said particulate mixture of reactants being comprised of $Bi_2CaSr_2Cu_2O_{8\pm x}$ where x ranges from 0 to 0.5, $Ca_2CuO_3$, cupric oxide, and lead oxide, said mixture of reactants being formulated to produce the superconductive phase and to provide an excess amount of said $Ca_2CuO_3$ and cupric oxide sufficient to drive the reaction to produce the superconductive phase in said sintered body, said $Ca_2CuO_3$ and cupric oxide in the mixture being present in substantially mole equivalents to each other;

(b) applying an aligning magnetizing field to the slurry to align said $Bi_2CaSr_2Cu_2O_{8\pm x}$ crystals with their c-axis substantially parallel to each other;

(c) removing the organic liquid vehicle in the aligning field producing a cast body wherein $Bi_2CaSr_2Cu_2O_{8\pm x}$ crystals are aligned with their c-axis substantially parallel to each other;

(d) firing the cast body in an oxidizing atmosphere at a reaction temperature ranging from 820° C. to 860° C. converting the $Bi_2CaSr_2Cu_2O_{8\pm x}$ to superconductive crystalline $Bi_{2-y}Pb_yCa_2Sr_2Cu_3O_{10\pm z}$ phase;

(e) cooling the intermediate product in an oxidizing atmosphere producing a solid intermediate product;

(f) applying to the pressing surface of intermediate product a uniaxial pressure which is substantially parallel to the c-axis of said superconductive phase to produce a pressed product with a thickness which is the same or less than the thickness of the cast body;

(g) finally firing the resulting pressed product in an oxidizing atmosphere at a reaction temperature ranging from 820° C. to 860° C. to produce a finally sintered reaction product wherein the superconductive phase comprises at least 90% by weight of the reaction product, said reaction temperature being below the temperature at which sufficient liquid forms to prevent production of the sintered products; and (h) cooling the finally sintered reaction product in an oxidizing atmosphere producing a solid sintered body having an open porosity ranging from 5% to less than 25% by volume of the body.

2. The process according to claim 1, wherein said oxidizing atmosphere is air.

3. The process according to claim 1, wherein said reaction temperature in steps (d) and (g) ranges from 820° C. to 840° C.

4. The process according to claim 1, wherein said reaction temperature in steps (d) and (g) is 835° C.

5. The process according to claim 1, where y in said superconductive phase ranges from 0.25 to 0.35.

6. The process according to claim 1, where y in said superconductive phase is 0.3.

7. A process for making oriented superconductive crystalline $Bi_{2-y}Pb_yCa_2Sr_2Cu_3O_{10\pm z}$ in which y is from 0.1 to 0.5 and z is from zero to less than 1 which comprises forming a slurry comprising an organic liquid vehicle, $Bi_2CaSr_2Cu_2O_{8\pm x}$ where x is from 0 to 0.5, $Ca_2CuO_3$, cupric oxide, and lead oxide; simultaneously removing the liquid vehicle while aligning the $Bi_2CaSr_2Cu_2O_{8\pm x}$ with substantially parallel c-axes by means of an external magnetic field; heating the resulting admixture at a temperature between about 820° C. and 860° C. to convert aligned $Bi_2CaSr_2Cu_2O_{8\pm x}$ to aligned $Bi_{2-y}Pb_yCa_2Sr_2Cu_3O_{10\pm z}$.

8. A process for making a sintered body of oriented crystalline $Bi_{2-y}Pb_yCa_2Sr_2Cu_3O_{10\pm z}$ where y is from 0.1 to 0.5 and z is from zero to less than 1 which comprises applying an external magnetic field to field a slurry comprising a non-aqueous liquid vehicle, $Bi_2CaSr_2Cu_2O_{8\pm x}$, $Ca_2Cu_3$, cupric oxide and lead oxide to align the c-axes of the $Bi_2CaSr_2Cu_2O_{8\pm x}$; removing the liquid vehicle while maintaining the magnetic field to provide a cast body comprising aligned $Bi_2CaSr_2Cu_2O_{8\pm x}$; firing the cast body in an oxidizing atmosphere at a temperature from about 820° C. to about 860° C. to convert $Bi_2CaSr_2Cu_2O_{8\pm x}$ to aligned $Bi_{2-y}Pb_yCa_2Sr_2Cu_3O_{10\pm z}$; applying uniaxial pressure substantially parallel to the c-axis of the $Bi_{2-y}Pb_yCa_2Sr_2Cu_3O_{10\pm z}$ to provide a body having substantially the same thickness as the cast body; firing the pressed body in an oxidizing atmosphere at temperature between about 820° C. and about 860° C. to provide a sintered body comprising at least 90% by weight superconductive $Bi_{2-y}Pb_yCa_2Sr_2Cu_3O_{10\pm z}$.

* * * * *

UNITED STATES PATENT AND TRADEMARK OFFICE
CERTIFICATE OF CORRECTION

PATENT NO. : 5,057,486

DATED : October 15, 1991

INVENTOR(S) : Ronald H. Arendt and Mary F. Garbauskas

It is certified that error appears in the above-identified patent and that said Letters Patent is hereby corrected as shown below:

Column 14,

In claim 1, at line 1, delete the numeral "19" and substitute the number --7--.

Signed and Sealed this

Twenty-fourth Day of August, 1993

*Attest:*

BRUCE LEHMAN

*Attesting Officer*     *Commissioner of Patents and Trademarks*